(12) United States Patent
Lo

(10) Patent No.: US 8,460,972 B2
(45) Date of Patent: Jun. 11, 2013

(54) METHOD OF FORMING SEMICONDUCTOR PACKAGE

(75) Inventor: Wai Yew Lo, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 395 days.

(21) Appl. No.: 12/830,421

(22) Filed: Jul. 5, 2010

(65) Prior Publication Data
US 2011/0104853 A1   May 5, 2011

(30) Foreign Application Priority Data
Nov. 5, 2009 (MY) ................. PI 20094674

(51) Int. Cl.
*H01L 21/00* (2006.01)

(52) U.S. Cl.
USPC .......................... 438/113; 438/112

(58) Field of Classification Search
USPC ................................. 438/112, 113
See application file for complete search history.

(56) References Cited

U.S. PATENT DOCUMENTS

| 5,353,498 | A | 10/1994 | Fillion |
| 6,762,488 | B2* | 7/2004 | Maeda et al. ............ 257/686 |
| 7,298,032 | B2 | 11/2007 | Kim |
| 8,258,012 | B2* | 9/2012 | Pagaila et al. ............ 438/113 |
| 2007/0210427 | A1 | 9/2007 | Lytle |
| 2008/0026506 | A1 | 1/2008 | Kim |
| 2009/0032933 | A1 | 2/2009 | Tracht |
| 2009/0271980 | A1 | 11/2009 | Ramanathan |
| 2010/0073663 | A1 | 3/2010 | Meyer |

* cited by examiner

*Primary Examiner* — Jenny L Wagner
(74) *Attorney, Agent, or Firm* — Charles Bergere

(57) ABSTRACT

A method of forming a semiconductor package includes providing a transfer film and placing electronic components on the transfer film with active sides of the electronic components facing the transfer film. The electronic components include a first assembled package and one or more of a second assembled package and a passive component. A molding operation is performed to encapsulate the electronic components and one side of the transfer film. The transfer film is then removed, which exposes the active sides of the electronic components. An electrical distribution layer is formed over the active sides of the electronic components and electrically connects the electronic components. Conductive bumps are then formed on the electrical distribution layer.

7 Claims, 2 Drawing Sheets

METHOD OF FORMING SEMICONDUCTOR PACKAGE

BACKGROUND OF THE INVENTION

The present invention relates to the packaging of integrated circuits (ICs) and more particularly to a method of forming a redistributed chip package-in-package device.

In conventional redistributed chip packaging, either a single die or multiple dies are directly packaged into a single package. Consequently, the reliability of such packages is largely dependent on the use of known good dies. Another drawback of conventional redistributed chip packaging is that the dies are susceptible to damage during the assembly process. This reduces the reliability of such packages and increases waste.

In view of the foregoing, it would be desirable to have a method of forming a redistributed chip package with increased reliability and that reduces waste.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
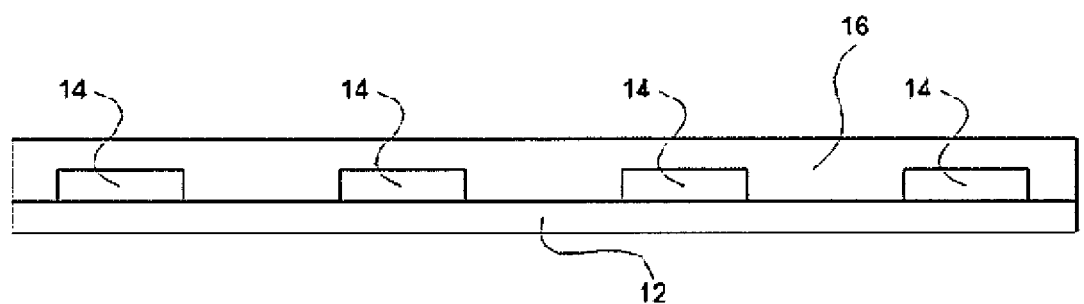
FIG. 1 is an enlarged cross-sectional view of a plurality of integrated circuit (IC) dies placed on a first transfer film and encapsulated with a first mold compound in accordance with an embodiment of the present invention.

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a method of forming a redistributed chip package-in-package device including the steps of providing a transfer film and placing a plurality of electronic components on the transfer film with active sides of the electronic components facing the transfer film. The electronic components include a first assembled package and one or more of a group comprising a second assembled package and a passive component. A molding operation is performed to encapsulate the electronic components and one side of the transfer film. The transfer film is then removed, thereby exposing the active sides of the electronic components. An electrical distribution layer is formed over the active sides of the electronic components and electrically connects the electronic components. A plurality of conductive bumps is formed on the electrical distribution layer.

The present invention also provides a method of forming a semiconductor package including the step of placing a plurality of integrated circuit (IC) dies on a first transfer film with an active side of the IC dies facing the first transfer film. A first molding operation is performed to encapsulate the IC dies and one side of the first transfer film. The first transfer film is then removed, thereby exposing the active side of the IC dies. A first electrical distribution layer is formed over the active side of each of the IC dies. A singulating operation is performed to separate adjacent ones of the IC dies, thereby forming a plurality of redistributed chip package devices. One or more of the redistributed chip package devices are placed on a second transfer film with an active side of the one or more redistributed chip package devices facing the second transfer film. A second molding operation is performed to encapsulate the one or more redistributed chip package devices and one side of the second transfer film. The second transfer film is then removed, thereby exposing the active side of the one or more redistributed chip package devices. A second electrical distribution layer is formed over the active side of the one or more redistributed chip package devices and a plurality of conductive bumps is formed on the second electrical distribution layer.

The present invention further provides a method of forming a redistributed chip package-in-package device including the steps of providing a transfer film and placing a plurality of redistributed chip package devices on the transfer film with an active side of the redistributed chip package devices facing the transfer film. A molding operation is performed to encapsulate the redistributed chip package devices and one side of the transfer film. The transfer film is then removed, thereby exposing the active side of the redistributed chip package devices. An electrical distribution layer is formed over the active side of the redistributed chip package devices. The electrical distribution layer electrically connects the redistributed chip package devices. A plurality of conductive bumps is formed on the electrical distribution layer.

FIGS. 1 through 4 are enlarged cross-sectional views that illustrate a method of forming a plurality of redistributed chip package-in-package devices 10 in accordance with an embodiment of the present invention.

Referring now to FIG. 1, a first transfer film 12 is provided and a plurality of integrated circuit (IC) dies 14 is placed on the first transfer film 12 with an active side of the IC dies 14 facing the first transfer film 12. A first molding operation is performed to encapsulate the IC dies 14 and one side of the first transfer film 12 with a first mold compound 16.

The first transfer film 12 may be a piece of tape such as a polyimide tape. Preferably, the first transfer film 12 has an adhesive on at least one of its sides.

The IC dies 14 may be processors, such as digital signal processors (DSPs), special function circuits, such as memory address generators, memories, or circuits that perform any other type of function. The IC dies 14 are not limited to a particular technology such as CMOS, or derived from any particular wafer technology. Further, the present invention can accommodate dies of various sizes, as will be understood by those of skill in the art. A typical example is a memory die having a size of about 15 mm by 15 mm. The active side of each of the IC dies 14 is a side that has a plurality of die bonding pads thereon.

The first mold compound 16 may comprise well-known commercially available molding materials such as plastic or epoxy.

Figure 2:
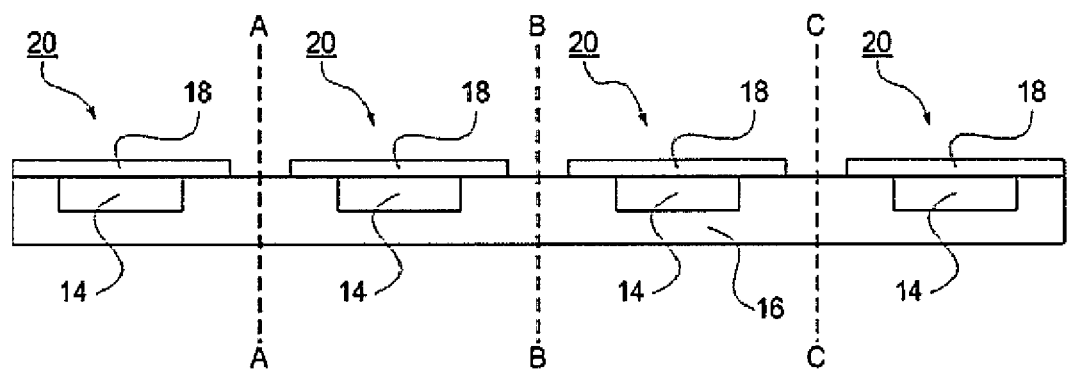
FIG. 2 is an enlarged cross-sectional view of the encapsulated IC dies of FIG. 1 with the transfer film removed and a first electrical distribution layer formed over the active side of each of the IC dies.

Referring now to FIG. 2, the first transfer film 12 is removed to expose the active side of the IC dies 14. The first transfer film 12 may be removed using a conventional tape stripping process. The encapsulated IC dies 14 are flipped over and a first electrical distribution layer 18 is formed over the active side of each of the IC dies 14. A first singulating operation is performed along lines A-A, B-B and C-C to separate adjacent ones of the IC dies 14 into a plurality of redistributed chip package devices 20. Singulation may be via mechanical saw or laser, or similar processes.

The first electrical distribution layer 18 may be formed using known photolithography and plating processes. In one embodiment, the first electrical distribution layer 18 is formed using a redistributed chip packaging (RCP) process. Preferably, the first electrical distribution layer 18 is built up to an array surface layout with a plurality of conductive pads for electrical testing.

Figure 3:
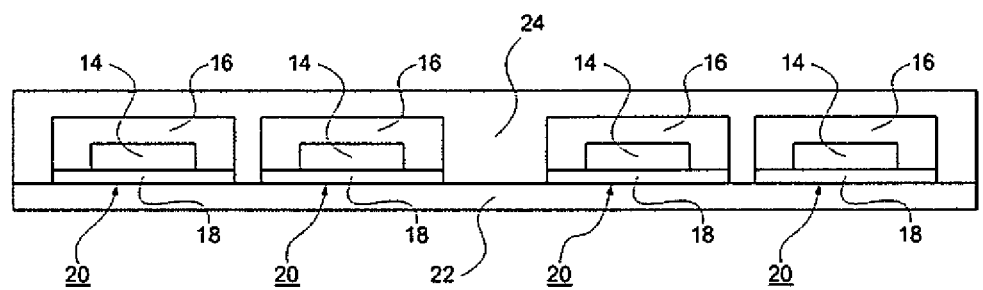
FIG. 3 is an enlarged cross-sectional view of a plurality of redistributed chip package devices of FIG. 2 placed on a second transfer film and encapsulated with a second mold compound.

Referring now to FIG. 3, a second transfer film 22 is provided and the redistributed chip package devices 20 are placed on the second transfer film 22 with an active side of the redistributed chip package devices facing the second transfer film 22. A second molding operation is performed to encapsulate the redistributed chip package devices 20 and one side of the second transfer film 22 with a second mold compound 24.

In the present embodiment, electrical testing is performed on the redistributed chip package devices 20 prior to placement on the second transfer film 22 and only known good packages are incorporated into the final redistributed chip package-in-package device 10. This increases the reliability of the final redistributed chip package-in-package device 10 and reduces waste. Electrical testing may be performed by making temporary electrical contact to contact pads (not shown) on the first electrical distribution layer 18 with a known test probe. The test probe may be an array probe.

The second transfer film 22 may be a piece of tape such as a polyimide tape. Preferably, the second transfer film 22 has an adhesive on at least one of its sides.

The second mold compound 24 may comprise well-known commercially available molding materials such as plastic or epoxy. The double molding operation affords the individual redistributed chip package devices 20 greater protection from moisture in the environment and also against harsh environments.

Figure 4:
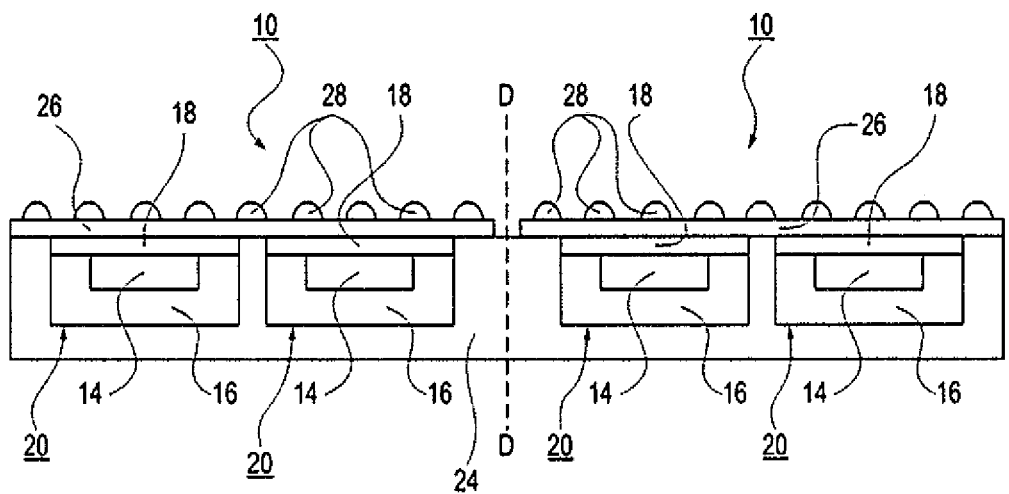
FIG. 4 is an enlarged cross-sectional view of the encapsulated redistributed chip package devices of FIG. 3 with the transfer film removed, a second electrical distribution layer formed over the active side of redistributed chip package devices, and a plurality of conductive bumps formed on the second electrical distribution layer.

Referring now to FIG. 4, the second transfer film 22 is removed to expose the active side of the redistributed chip package devices 20. The encapsulated redistributed chip package devices 20 are flipped over and a second electrical distribution layer 26 is formed over the active side of the redistributed chip package devices 20, the second electrical distribution layer 26 electrically connecting adjacent ones of the redistributed chip package devices 20. A plurality of conductive bumps 28 is formed on the second electrical distribution layer 26. A second singulating operation is performed along line D-D to separate adjacent ones of the redistributed chip package-in-package devices 10.

The second transfer film 22 may be removed using a conventional tape stripping process and the second electrical distribution layer 26 may be formed using known photolithography and plating processes. In one embodiment, the second electrical distribution layer 26 is formed using a redistributed chip packaging (RCP) process. The conductive bumps 28 may be formed on the second electrical distribution layer 26 using known solder ball attach processes. In one embodiment, the conductive bumps 28 are be C4 (Controlled, Collape, Chip, Connect) bumps. Singulation may be via mechanical saw or laser, or similar processes.

Although FIGS. 3 and 4 show only two (2) single-die redistributed chip package devices 20 incorporated in each of the redistributed chip package-in-package devices 10, it will be understood that fewer or more redistributed chip package devices 20 and/or other types of assembled packages and/or passive components may be packaged into one redistributed chip package-in-package device, depending on the required functionality of the redistributed chip package-in-package device. For example, a first assembled package may be packaged with a second assembled package and/or a passive component in one redistributed chip package-in-package device. In such an embodiment, the second electrical distribution layer is formed such that it electrically connects the electronic components in the redistributed chip package-in-package device. Examples of the types of assembled packages that may be incorporated into the redistributed chip package-in-package device include, but are not limited to, a single-die redistributed chip package, a stacked-die redistributed chip package, a wire bond package and a flip chip package.

As is evident from the foregoing discussion, the present invention provides a method of forming a redistributed chip package-in-package device. Because each individual package can be tested before being incorporated into the redistributed chip package-in-package device, only known good packages are incorporated into the redistributed chip package-in-package device. This increases the reliability of the redistributed chip package-in-package device and reduces wastage. Further advantageously, package input/output (I/O) density and functionality are also increased by packaging multiple packages within the redistributed chip package-in-package device. The redistributed chip package-in-package device also affords greater packaging flexibility as it allows incorporation of a combination of various package types including, but not limited to, wire bonded and flip chip packages and/or passive components into a single package. Still further, the double molding operation provides the individual units in the redistributed chip package-in-package device greater protection from moisture in the environment and also against harsh environments.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of forming a semiconductor package, comprising:
   placing a plurality of integrated circuit (IC) dies on a first transfer film, wherein an active side of the IC dies is facing the first transfer film;
   performing a first molding operation to encapsulate the IC dies and one side of the first transfer film;
   removing the first transfer film, thereby exposing the active side of the IC dies;

forming a first electrical distribution layer over the active side of each of the IC dies;

performing a singulating operation to separate adjacent ones of the IC dies, thereby forming a plurality of redistributed chip package devices;

placing one or more of the redistributed chip package devices on a second transfer film, wherein an active side of the one or more redistributed chip package devices is facing the second transfer film;

performing a second molding operation to encapsulate the one or more redistributed chip package devices and one side of the second transfer film;

removing the second transfer film, thereby exposing the active side of the one or more redistributed chip package devices;

forming a second electrical distribution layer over the active side of the one or more redistributed chip package devices; and forming a plurality of conductive bumps on the second electrical distribution layer.

2. The method of forming a semiconductor package of claim 1, further comprising placing one or more of a group comprising an assembled package and a passive component on the second transfer film prior to performing the second molding operation.

3. The method of forming a semiconductor package of claim 1, wherein the second electrical distribution layer electrically connects the one or more redistributed chip package devices and the one or more assembled packages and passive components.

4. The method of forming a semiconductor package of claim 1, further comprising performing electrical testing on the redistributed chip package devices prior to placement on the second transfer film.

5. The method of forming a semiconductor package of claim 1, wherein the one or more redistributed chip package devices are known good packages.

6. The method of forming a semiconductor package of claim 1, wherein the first electrical distribution layer is formed with a plurality of conductive pads.

7. The method of forming a semiconductor package of claim 1, wherein the first and second transfer films comprise a polyimide tape.

* * * * *